United States Patent
Shinohara

(12) 
(10) Patent No.: US 6,361,834 B1
(45) Date of Patent: Mar. 26, 2002

(54) RESIST FILM BAKING METHOD

(75) Inventor: Masaki Shinohara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/693,924

(22) Filed: Oct. 23, 2000

(30) Foreign Application Priority Data

Oct. 25, 1999 (JP) .......................................... 11-302330

(51) Int. Cl.⁷ ................................................ B05D 3/02
(52) U.S. Cl. .................. 427/444; 427/385.5; 427/389.7
(58) Field of Search .......................... 427/389.7, 388.1, 427/385.5, 444; 118/500, 59

(56) References Cited

U.S. PATENT DOCUMENTS 4,508,161 A * 4/1985 Holden ........................... 165/1

FOREIGN PATENT DOCUMENTS

JP 62-101027 * 5/1987
JP 5-29419 * 2/1993

* cited by examiner

Primary Examiner—Katherine A. Bareford
(74) Attorney, Agent, or Firm—McGinn&Gibb, PLLC

(57) ABSTRACT

The present invention provides a resist film baking apparatus including a substrate placing block 2 which can be deformed, a baking plate 1 having an inner void 3, and a temperature regulator 4 connected to the baking plate 1 for circulating a temperature regulating liquid 7 in the inner void 3. This configuration enables to uniformly heat a substrate so as to obtain a resist film having a uniform thickness, which in turn enables to obtain an accurate element pattern.

13 Claims, 3 Drawing Sheets

6 GRASP INSTRUMENT

12 COOLING TEMPERATURE REGULATOR

11 HEATING TEMPERATURE REGULATOR

RESIST FILM BAKING METHOD

BACKGROUND OF THE INVENTION

1. Field of the Invention

The present invention relates to a resist film baking apparatus and a resist film baking method and in particular, to an apparatus and a method for baking a resist film formed on a surface of a glass substrate or the like.

2. Description of the Related Art

Conventionally, the liquid crystal display apparatus production procedure includes a photoresist (hereinafter, referred to as a resist) application step where a resist film formed on a glass substrate is baked by a resist film baking apparatus.

This conventional resist film baking apparatus, as shown in FIG. 4, includes a heater 8 arranged inside the apparatus, an absorption groove 9 at the end of a contact plane 2A with which a glass substrate 5 is in contact, and lift pins 10 for separating the glass substrate 5 from the contact plane 2A and receiving the glass substrate 5. The contact plane 2A can be set to a desired temperature by the heater 8.

However, in the aforementioned conventional resist film baking apparatus having the absorption groove and the lift pins on the contact plane, the temperature distribution cannot be uniform because of the absorption groove and the lift pins, changing the resist film thickness. This deteriorates the element formation pattern accuracy, causing display irregularities in the liquid crystal display apparatus. Moreover, sliding of the lift pins for receiving and separating a glass substrate generates contaminants which adhere to the substrate, causing display irregularities.

SUMMARY OF THE INVENTION

It is therefore an object of the present invention to provide a resist film baking apparatus and a resist film baking method capable of uniformly heating an entire substrate without causing contaminants.

The resist film baking apparatus according to the present invention comprises: a substrate placing block which can be deformed and on which a substrate having a resist film is placed; a baking plate having an inner void; and a temperature regulator connected to the baking plate so as to circulate a temperature regulating liquid in the inner void. The substrate placing block can be made from a flexible metal or synthetic resin. The substrate placing block is made from a polyimide resin or silicon rubber. Moreover, as the temperature regulating liquid, pure water or diethylene glycol is used.

The resin film baking method according to the present invention performs baking of a resist film formed on a substrate surface using the aforementioned resist film baking apparatus.

DESCRIPTION OF THE PREFERRED EMBODIMENTS

Figure 1:
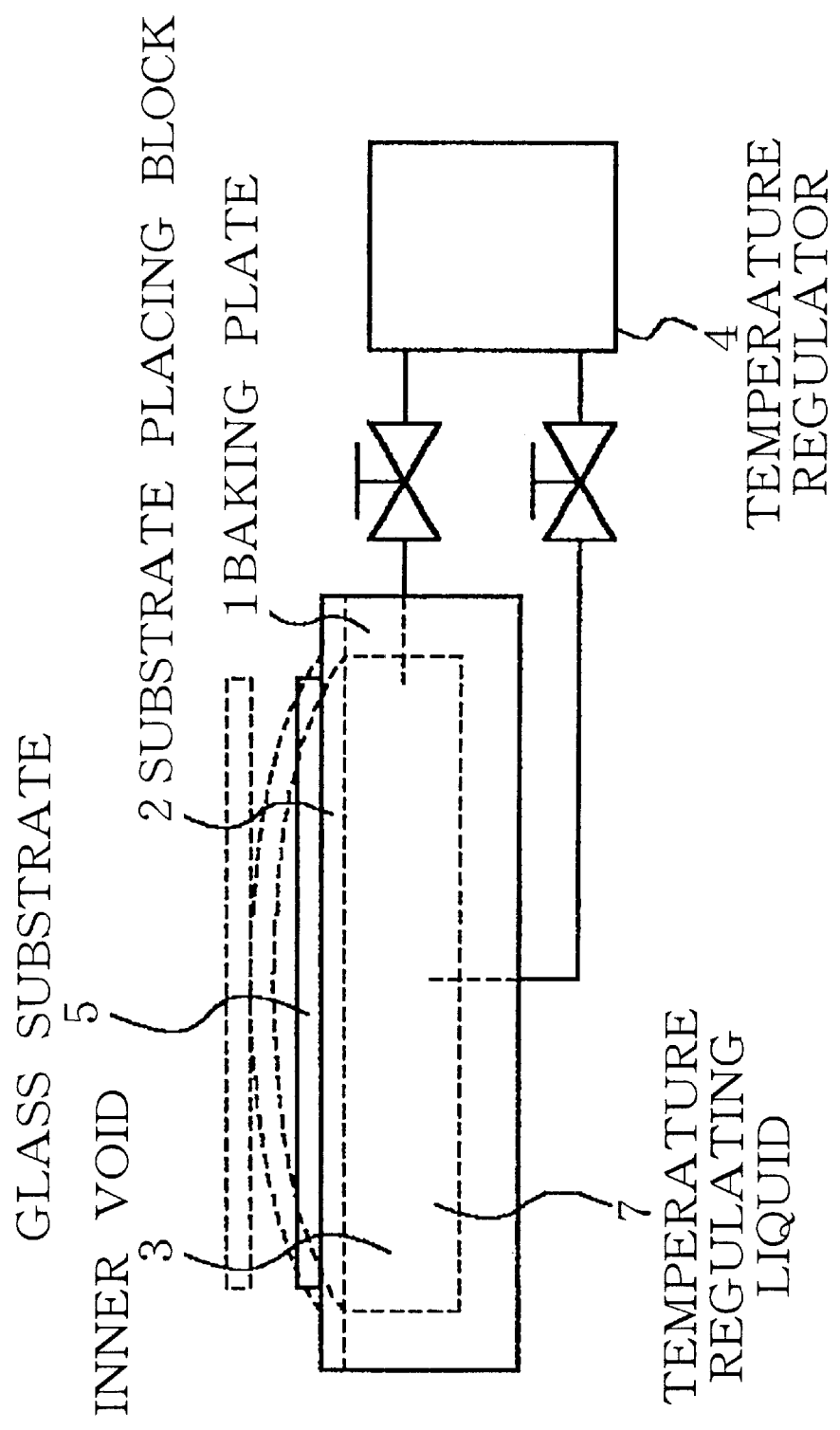
FIG. 1 is a front view of a resist film baking apparatus according to a first embodiment of the present invention.

Description will now be directed to the present invention with reference to the attached drawings. FIG. 1 is a front view of a baking apparatus for explaining a first embodiment of the present invention.

Referring to FIG. 1, the resist film baking apparatus includes a deformable substrate placing block 2 made from a polyimide resin or silicon rubber for placing a glass substrate 5 having a resist film formed thereon, a baking plate 1 having an inner void 3 inside, and a temperature regulator 4 connected to the baking plate 1 for circulating a temperature regulating liquid 7 which is pure water or ethylene glycol in the inner void 3.

Next, referring to FIG. 2, explanation will be given on the baking method as the second embodiment for baking a resist film formed on a glass substrate using the aforementioned baking apparatus.

Figure 2A:
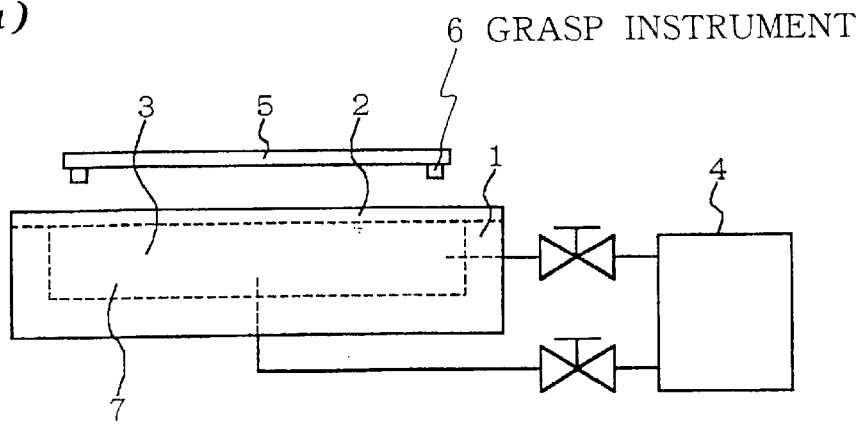
FIGS. 2(A)–2(D) are front views of the resist film baking apparatus for explaining a baking method according to a second embodiment of the present invention.
Figure 2B:
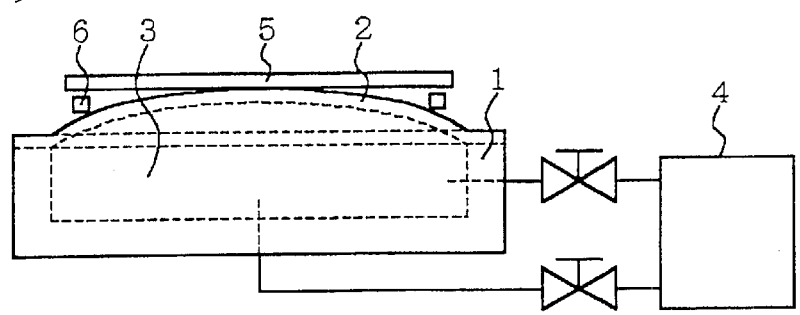

Firstly, as shown in FIG. 2(a), using a substrate grasp instrument 6 made from an aluminum alloy whose surface is coated with alumite, a glass substrate 5 (for example, 550 mm×650 mm) having a resist film formed on its surface is carried to a position above the baking plate 1.

Next, by increasing the discharge pressure of the temperature regulating liquid to be circulated in the inner void 3 from the temperature regulator 4, the substrate placing block 2 is deformed to protrude upward (by about 10 mm) so as to be brought into contact with the back surface of the glass substrate 5 and to lift the glass substrate 5 apart from the grasp instrument 6. Then, the grasp instrument 6 is removed from above the baking plate 1.

Subsequently, the discharge pressure of the circulating temperature regulating liquid is decreased so that the substrate placing block returns to its flat shape and simultaneously with this, the glass substrate is totally attached to the substrate placing block 2 thus, the glass substrate having a deflection of several millimeters is completely attached to the substrate placing block 2. Next, the temperature regulating liquid 7 having a predetermined temperature set by a temperature regulator including a heater and a heat exchanger is made to circulate in the inner void 3 to bake the resist film on the glass substrate 5. When the baking temperature is in a range from 80 to 100 degrees C., pure water is used as the temperature regulating liquid. When the baking temperature is in a range from 100 to 130 degrees C., ethylene glycol is used as the temperature regulating liquid.

Figure 2C:
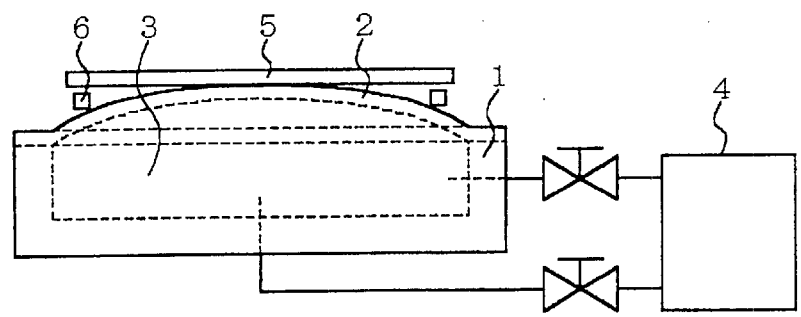

Next, as shown in FIG. 2(c), upon completion of a resist film baking, the discharge pressure of the circulating liquid is again increased so that the substrate placing block 2 protrudes upward to lift the glass substrate 5 and the grasp instrument 6 is inserted below the end portion of the substrate 5.

Figure 2D:
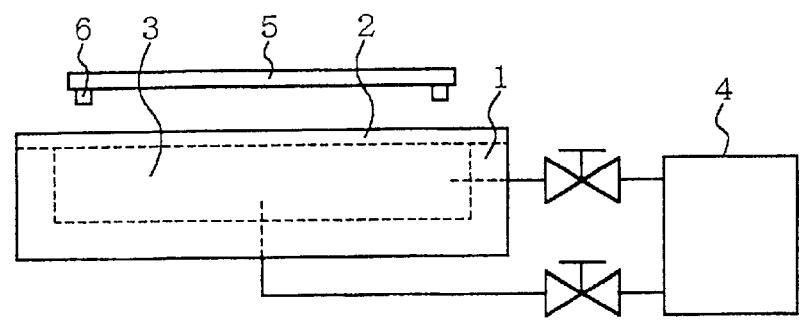

Next, as shown in FIG. 2(d), the discharge pressure of the circulating liquid is lowered top return the substrate placing block 2 to its flat shape so that the glass substrate 5 is held by the grasp instrument 6. The glass substrate 5 is carried by the grasp instrument 6, thus completing the baking process.

Figure 3:
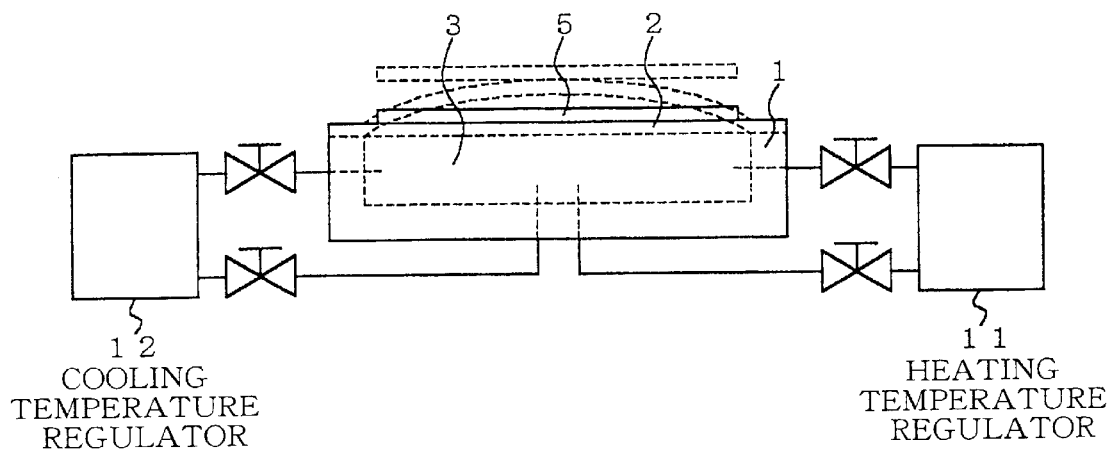
FIG. 3 is a front view of a baking apparatus for explaining a third embodiment of the present invention.
Figure 4:
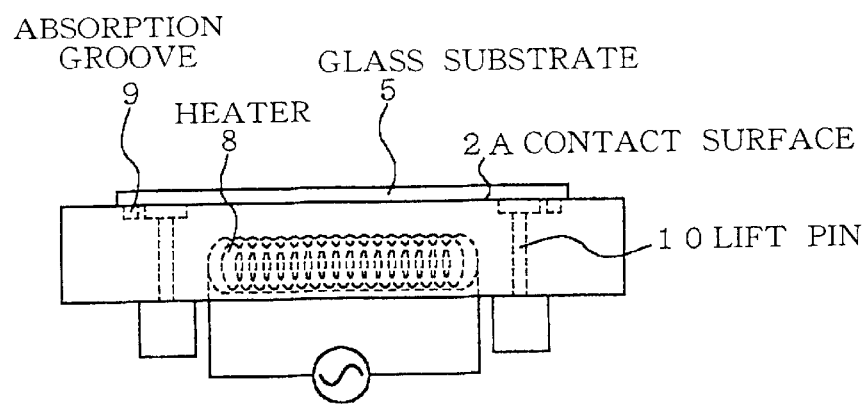
FIG. 4 is a front view of a conventional baking apparatus.

FIG. 3 is a front view of the baking apparatus for explaining a third embodiment of the present invention. Unlike FIG. 1, the temperature regulator includes a heating temperature regulator 11 having a heater and a cooling temperature regulator 12 having a coolant tank.

In this third embodiment, temperature of the temperature regulating liquid 7 in the inner void 3 can be rapidly adjusted to a predetermined temperature by the heating temperature regulator 11 and the cooling temperature regulator 12. Furthermore, pressure of the temperature regulating liquid 7 can also be adjusted. Thus, in the third embodiment, since the temperature regulator consists of the cooling temperature regulator and the heating temperature regulator, it is possible to reduce the time required for change the temperature to a predetermined value. This in turn reduces the tact of the baking apparatus.

It should be noted that in the aforementioned embodiments, explanation has been given on the case of the glass substrate. However, the present invention can also be applied to baking of a resist film on a semiconductor substrate having a diameter not less than 300 mm.

As has been described above, the present invention has the following effects.

Firstly, the back surface of a substrate can be completely attached to the substrate placing block, which enables to uniformly heat the entire back surface and obtain a resist film of a uniform thickness.

Secondly, there is no need of a complicated structure such as lift pins for passing the substrate, which reduces occurrences of failure of the baking apparatus.

Thirdly, there is no sliding portion of lift pins for passing the substrate and no contaminants are generated. This contributes to reduce baking failures.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 11-302330 (Filed on Oct. 25$^{th}$, 1999) including specification, claims, drawings and summary are incorporated herein by reference in its entirety.

What is claimed is:

1. A resist film baking method for baking a resist film formed on a substrate comprising:

providing a resist film baking apparatus which includes a deformable substrate placing block situated above and adjacent a baking plate having an inner void and a temperature regulator connected to said baking plate for circulating a temperature regulating liquid in said inner void;

placing a substrate having a resist film on said deformable substrate placing block;

circulating said temperature regulating liquid in said inner void of said baking plate of said baking apparatus; and baking the resist film on the substrate by circulating said temperature regulating liquid at a predetermined temperature set by said temperature regulator.

2. A resist film baking method as claimed in claim 1, wherein the substrate placing block is made from a flexible metal or synthetic resin.

3. A resist film baking method as claimed in claim 2, wherein the substrate placing block is made from a polyimide resin or silicon rubber.

4. A resist film baking method as claimed in claim 1, wherein the temperature regulating liquid is pure water or diethylene glycol.

5. A resist film baking method as claimed in claim 1, wherein the temperature regulator comprises a heating temperature regulator and a cooling temperature regulator.

6. A resist film baking method for baking a resist film formed on a substrate comprising:

providing a resist film baking apparatus which includes a deformable substrate placing block situated above and adjacent a baking plate having an inner void and a temperature regulator connected to said baking plate for circulating a temperature regulating liquid in said inner void;

using a grasp instrument to position a glass substrate having a resist film formed on a surface adjacent and above said baking plate and said deformable substrate placing block, with said temperature regulating liquid regulated by said temperature regulator connected to said baking plate;

deforming said substrate placing block by increasing a discharge pressure of the temperature regulating liquid from said temperature regulator such that said substrate placing block protrudes upward to contact said glass substrate and lift said glass substrate apart from said grasp instrument;

removing said grasp instrument from said position adjacent and above said baking plate;

decreasing said discharge pressure of the temperature regulating liquid such that said substrate placing block returns to its original form and the glass plate becomes totally attached to said substrate placing block; and baking the resist film on the glass substrate by circulating said temperature regulating liquid in said inner void at a predetermined temperature set by said temperature regulator.

7. A resist film baking method as claimed in claim 6, wherein said temperature regulator includes a heater and a heat exchanger.

8. A resist film baking method as claimed in claim 6, wherein the substrate placing block comprises one of a flexible metal and synthetic resin.

9. A resist film baking method as claimed in claim 6, wherein the substrate placing block is made from one of a polyimide resin and silicon rubber.

10. A resist film baking method as claimed in claim 6, wherein the temperature regulating liquid comprises one of pure water and diethylene glycol.

11. A resist film baking method as claimed in claim 6, wherein the temperature regulating liquid comprises pure water and wherein a baking temperature is in a rage from 80–100° C.

12. A resist film baking method as claimed in claim 6, wherein the temperature regulating liquid comprises diethylene glycol and wherein a baking temperature is in a range from 100–130° C.

13. A resist film baking method as claimed in claim 6, further comprising:

increasing the discharge pressure of said temperature regulating liquid upon completion of said baking such that said substrate placing block deforms to protrude upward to lift said glass substrate from said substrate placing block;

inserting said grasp instrument in a position between said glass substrate and said substrate placing block; and lowering a discharge pressure of said circulating liquid such that said substrate placing block returns to its original form causing said glass substrate to be held by said grasp instrument.

* * * * *